United States Patent [19]

Frigo et al.

[11] Patent Number: 5,232,869

[45] Date of Patent: Aug. 3, 1993

[54] METAL DEPOSITION

[75] Inventors: Dario M. Frigo; Antonius W. Gal, both of Arnhem, Netherlands

[73] Assignee: Shell Research Limited, United Kingdom

[21] Appl. No.: 920,735

[22] Filed: Jul. 28, 1992

[30] Foreign Application Priority Data

Jul. 30, 1991 [GB] United Kingdom ............... 9116381

[51] Int. Cl.$^5$ ..................... H01L 21/20; B05D 5/12
[52] U.S. Cl. ..................... 437/133; 437/126; 427/124; 156/610; 156/613
[58] Field of Search ............ 437/126, 133, 81, 88, 437/231, 102; 427/252, 123, 124; 156/610, 614, 613

[56] References Cited

U.S. PATENT DOCUMENTS

| 4,066,481 | 1/1978 | Manasevit et al. ............... 156/614 |
| 4,220,488 | 9/1980 | Duchemin et al. ............... 156/614 |
| 4,594,173 | 1/1986 | Hobgood et al. ............... 156/607 |
| 4,734,999 | 4/1988 | Fujisawa et al. . | |

FOREIGN PATENT DOCUMENTS 0022349 1/1981 European Pat. Off. .

OTHER PUBLICATIONS

"Point-of-use Arsine Generation for Organometallic Vapor-Phase Epitaxial Growth" by Salzman et al., J. Appl. Phys., pp. 1185-1189, Aug. 1, 1989.
"Organometallic Precursors in the Growth of Epitaxial Thin Films of Groups III-V Semiconductors by Metal-Organic Chemical Vapor Deposition", Zanella et al, Chem. Mater. 1991, 3, 225-242, Mar./Apr. 1991.

*Primary Examiner*—Olik Chaudhuri
*Assistant Examiner*—Ramamohan R. Paladugu

[57] ABSTRACT

In the deposition of metal on solid substrates by a Metal Organic Chemical Deposition process, an improvement comprises the provision of vapors of a precursor of the metal by passing an inert carrier gas through a mixture of the metal precursor and a liquid having a vapor pressure at ambient temperature lower than that of the metal precursor and in which the metal precursor is at least partially soluble.

12 Claims, No Drawings

METAL DEPOSITION

FIELD OF THE INVENTION

This invention relates to an improved method for the deposition of a thin film of metal upon a suitable solid substrate which comprises transporting a metal precursor of the metal to the substrate by means of a carrier gas.

BACKGROUND OF THE INVENTION

Thin films of metal are frequently fabricated upon solid substrates for use in the electronics and opto-electronics industries by what is termed a Metal Organic Chemical Vapor Deposition (MOCVD) process. The process typically comprises introducing the vapor of at least one metal-organic compound, i.e., the precursor of the metal, into a reactor under conditions of temperature and pressure such that the precursor decomposes to give a deposit of the metal on a solid substrate contained within the reaction chamber. The deposit is typically obtained as a thin film of the metal on the substrate. In the deposition of what is termed III-V semiconducting materials, vapors comprising at least one element of Group III of the Periodic Table are mixed with vapors of at least one element of Group V of the Periodic Table and the resulting thin film deposited by the process are a III-V semiconducting material or alloys of the Group III and Group V metals. Examples of III-V materials which are prepared by such a method include GaAs, AlAs, InP and alloys thereof, e.g., materials such as $Al_xGa_{1-x}As$, $Ga_yIn_{1-y}P$ and $Ga_xIn_{1-x}As_yP_{1-y}$ wherein x and y independently are in the range of zero to 1 inclusive. These materials are commonly referred to as ternary and quaternary alloys. It should be understood that the above III and V designations refer to the elements of Groups 3a and 5a of the Periodic Table of Elements of the Handbook of Chemistry and Physics, 63rd Ed.

For the fabrication of devices of specific electronic properties, it is necessary to precisely control the composition and the thickness of the layer being deposited by the MOCVD process. This control in turn requires the careful control of the metal precursor vapors entering the reaction chamber. The manner by which the latter control is achieved depends in part upon the physical state of the metal precursor at ambient temperature and one atmosphere pressure. For example, metal precursors which are gases at those conditions are often stored in a high pressure cylinder and the dosimetry of the metal precursor, in gaseous form, to the reactor is controlled by a calibrated mass-flow controller. In contrast, solid and liquid precursors are usually placed in a vessel equipped with an inlet and an outlet so that a carrier gas such as hydrogen, helium, argon or nitrogen can be passed through the vessel to entrain vapors of the metal precursor and conduct the vapors to the reactor.

The vessel typically employed in MOCVD is known as a "bubbler" and is a vessel fitted with an inlet tube which conducts carrier gas to the bottom of a sample of metal precursor material by means of a dip-tube, and an outlet which opens directly from the top of the vessel. The carrier gas thereby entrains some of the vapors of the metal precursor before leaving the bubbler at its outlet.

When a bubbler is employed to control the dosimetry of metal precursors into an MOCVD reactor, accurate control of the carrier gas is achieved through the use of a mass-flow controller. However, the entrainment of solid or liquid metal precursor vapors depends upon the contact between the carrier gas and the metal precursor as well as the rate at which the carrier gas becomes saturated with metal precursor vapor. Some metal precursors readily and rapidly saturate the carrier gas. Other materials, e.g., solid arsenic, do not readily vaporize and carrier gas saturation is difficult and slow. An additional common problem is the tendency of many solid organometallic compounds to react with traces of oxygen or water in the carrier gas to form an oxide skin over the non-gaseous phase which retards vaporization and again makes saturation of the carrier gas difficult.

Reproducible dosimetry from a conventional MOCVD bubbler is obtained if saturation of the carrier gas with metal precursor vapor under the conditions employed is ensured and maintained. Under typical operating conditions of temperature and pressure, metal precursors which are liquid will approach saturation of the carrier gas to an extent which will provide reproducible dosimetry of metal precursor vapor from a conventional bubbler until the liquid metal precursor has essentially been exhausted, or at least for so long as the entire carrier gas is able to bubble through the liquid metal precursor.

For solid metal precursors, however, the concentration of metal precursor vapor in the carrier gas is highly variable and typically fluctuates throughout the usage of the precursor. The fluctuation of metal precursor concentration is considered to be likely due at least in part to changes in the surface of the solid being employed as metal precursor.

One of the more difficult metal precursors to employ in a MOCVD process is trimethylindium, $(CH_3)_3In$. This material is a crystalline solid melting at 89° C. and is by far the most commonly used metal precursor for the deposition of indium. The use of trimethylindium becomes particularly difficult when it is desired to provide a metallic layer of the same crystalline structure as that of the solid substrate. Even small variations in the dosimetry of vapors resulting from trimethylindium produce undesired and unsatisfactory results.

Various attempts have been made to improve deposition of a metal from solid metal precursors such as trimethylindium. One such attempt utilized triethylindium as a replacement. However, although this latter compound is a liquid at ambient temperature, it has a vapor pressure considerably lower than trimethylindium and is less thermally stable. In part because of these factors, triethylindium does not produce uniform deposition over the surface of the substrate. Other indium-containing liquid such as

$(CH_3)_3In.NH[CH(CH_3)_2]_2,$

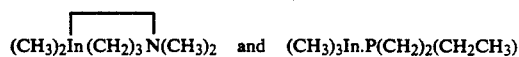

$(CH_3)_2In(CH_2)_3N(CH_3)_2$ and $(CH_3)_3In.P(CH_2)_2(CH_2CH_3)$

$(CH_3)_3In.P(CH_2)_2(CH_2CH_3)$ have also been evaluated as a metal precursor but each of these compounds has a vapor pressure below that of trimethylindium and the resulting rate of growth of indium deposit is undesirably slow.

Mechanical variations have also been used to attempt to improve the efficiency of trimethylindium use, for example, by reversing the flow of carrier gas through the bubbler. In published Japanese application 01-265511 the trimethylindium precursor is deposited on spherical supports. It has also been suggested to melt the trimethylindium prior to use to provide more uniform surface of the sample. In an article by Butler et al, "Variations in TMI Partial Pressure Measured by Ultrasonic Cell on a MOVPE-Reactor", J. of Cr. Gr., 94, pp. 481-487 (1989), it is suggested to monitor the composition of the carrier gas leaving the bubbler maintained at constant temperature. The flow of carrier gas is then adjusted to compensate for any increase or decrease in the efficiency of the collection of metal precursor vapor. Adducts of trimethylindium and organic compounds such as alkylphosphines are used in U.S. Pat. No. 4,716,130. Another approach is to modify the conventional bubbler with a special diffuser and enclosing the metal precursor within a porous membrane. Such apparatus provides more reliable dosimetry but tends to become plugged through formation of oxides by reaction with impurities in the carrier gas.

Each of the above methods suffers from some disadvantage which causes the procedure to be more complex and/or less economical. It would be of advantage to provide a method for conducting a MOCVD process in which a solid metal precursor is used in a conventional bubbler but in which a reproducible dosimetry of entrainment of metal precursor vapors is obtained.

SUMMARY OF THE INVENTION

The present invention provides an improved method for the deposition of a metal from a metal precursor during a conventional Metal Organic Chemical Vapor Deposition (MOCVD) process. More particularly, the present invention provides a process for the MOCVD utilization of a solid, particularly trimethylindium, to provide reproducible dosimetry of a metal precursor vapor and a metal precursor vapor pressure sufficient to afford metal deposition at an acceptable rate. The process of the invention comprises contacting a carrier gas and the solid metal precursor while the precursor is in contact with a liquid of relatively low vapor pressure in which the metal precursor is at least partially soluble.

DESCRIPTION OF THE INVENTION

The process of the invention comprises the use of a carrier gas to entrain vapor of a metal precursor by passing through a mixture of the solid metal precursor and a liquid having a vapor pressure lower than that of the metal precursor and in which the metal precursor is at least partially soluble. The passing is at a substantially constant rate which will permit substantial saturation of the carrier gas with the metal precursor. The procedure provides carrier gas of relatively constant metal precursor vapor content and sufficiently high metal precursor concentration to permit efficient use in a Metal Organic Chemical Vapor Deposition process using conventional MOCVD equipment.

The metal precursor is present as a solid which is partially dissolved in the liquid of relatively low volatility. The amount of liquid to be used relative to the metal precursor is not critical but preferably is sufficient to allow the bottom of the bubbler to extend below the surface of the liquid. This permits efficient intimate contact between the liquid, solid and carrier gas. However, the presence of liquid only sufficient to permit covering of the surfaces of the solid with a film of liquid is sufficient to increase the evaporation efficiency of the metal precursor and provide reliable dosimetry of the metal precursor. The amount of liquid is sufficient to dissolve only a portion of the solid and it is required that the metal precursor remain in part as a solid phase. Good results are obtained if no more than 50% by weight of the metal precursor initially dissolves in the liquid present. Better results are obtained if at least 65% by weight of the metal precursor remains initially undissolved and it is particularly suitable if at least 80% of the metal precursor remains initially undissolved.

The metal precursor is a source of metal useful in the production of metal deposits on solid substrates and has a vapor pressure sufficient to permit such metal deposition by a MOCVD process. Although precursors of other metals have the requisite vapor pressure to be useful in the process of the invention, the preferred metal is indium and the metal precursor of choice is trimethylindium. It is useful on occasion to provide the metal precursor as a complex of the metal precursor and a Lewis base which is free from active hydrogen atoms such as an amine, phosphine, arsine, ether or thioether. These complexes are often relatively volatile and are used to effectively lower the vapor pressure of a metal precursor which would otherwise be unduly high. Preferred Lewis bases for use in the formation of such complexes are tertiary amines, e.g., dimethyldodecylamine, triazines including 1,3,5-triethylhexahydro-1,3,5-triazine and polyethers such as tetraethylene glycol dimethyl ether.

The liquid of relatively low volatility used as a partial solvent in the process of the invention is a liquid having a melting point less than ambient temperature but having a vapor pressure lower than that of the metal precursor at the temperature of operation, typically ambient temperature. Suitable liquids have normal boiling points, i.e., the boiling point at atmospheric pressure, of at least 150° C. and preferably of at least 200° C. In one embodiment of the invention the liquid is a hydrocarbon, straight-chain or branched, aliphatic or aromatic, of at least 9 carbon atoms inclusive. Illustrative of such solvents are dodecane, hexadecane, 2-methyltetradecane, sec-butylbenzene and propylbenzene. In an alternate embodiment, the liquid is an excess of the Lewis base employed in the formation of a complex of the metal precursor.

The process is conducted by passing an inert carrier gas such as nitrogen, argon, helium or hydrogen through the mixture of solid metal precursor and liquid of relatively low volatility as by employing a bubbler of the type typically used in a MOCVD process. This contacting is typically conducted at ambient temperature, e.g., from about 15° C. to about 30° C., and a pressure sufficient to cause passage of the carrier gas through the mixture. Without wishing to be bound by any particular theory, it appears probable that the carrier gas becomes at least substantially saturated with metal precursor vapor by passage through the liquid and by contact with the surface of the solid metal precursor. The liquid of relatively low volatility does not vaporize to any considerable extent and thus does not form a major constituent of the carrier gas leaving the bubbler. As the carrier gas depletes the dissolved metal precursor of the liquid of relatively low volatility, additional solid metal precursor dissolves to maintain saturation of the liquid by metal precursor. Thus, the carrier gas leaving the bubbler will remain substantially saturated in metal precursor vapor until a high proportion, e.g., at least about 80% by weight, of the metal precursor has been volatilized and removed. The process provides relatively high and relatively constant concentrations of metal precursors such as trimethylindium in the carrier gas which is then usable in MOCVD processes to produce high quality, reproducible deposits of metal on solid substrates.

The process is particularly useful for the deposition of indium from trimethylindiun for electrical and electronic applications.

The invention is further illustrated by the following Illustrative Embodiments which should not be regarded as limiting.

ILLUSTRATIVE EMBODIMENT I

To 100g of trimethylindium was added 140g of hexadecane and the mixture was allowed to stand overnight. During this time 3g of the trimethylindium dissolved and a slush of trimethylindium in 143g of liquid phase had formed. The total contents were transferred to a conventional MOCVD bubbler which was held at 25° C. with a flow rate for carrier gas of 200 standard $cm^3$/minute. The bubbler was used as the source of indium and gave a reproducible dosimetry until more than 80% of the original trimethylindium had been consumed.

ILLUSTRATIVE EMBODIMENT II

Seventy grams of solid trimethylindium and 12.7g of N,N-dimethyldodecylamine were added to a cylindrical stainless steel bubbler. The contents were held at 30° C. until 17g of the solid dissolved. Platinum-diffused hydrogen was used as the carrier gas to entrain and remove the dimethylindium. At a continuous carrier gas flow rate of 500 standard $cm^3$/minute, a stable output of trimethylindium, i.e., a constant concentration of trimethylindium in the carrier gas, was obtained until only about 5g of the solid trimethylindium remained.

For comparison, 50g of solid trimethylindium was placed in a similar vessel. Under identical conditions of flow of carrier gas and temperature, a progressive depletion of the output of trimethylindium was observed after 23g of the trimethylindium had been consumed. The depletion was observed even though the flow of carrier gas was intermittently stopped to allow the gas to regain saturation.

ILLUSTRATIVE EMBODIMENT III

To 100g of trimethylindium was added 5g of 1,3,5-triethylhexahydro-1,3,5-triazine and the resulting mixture was allowed to stand overnight at 25° C. After this time, 14g of the trimethylindium had dissolved in the amine and a slush of trimethylindium in 19g of liquid phase had formed. This slush was used to obtain a reproducible dosimetry of trimethylindium as described in Illustrative Embodiment I.

ILLUSTRATIVE EMBODIMENT IV

To 100g of trimethylindium was added 2g of tetraglyme and the mixture was allowed to stand overnight at 25° C. After this time 6.6g of the trimethylindium had dissolved to form a slush of trimethylindium in 8.6g of liquid phase. The slush was used to obtain a reproducible dosimetry of trimethylindium as described in Illustrative Embodiment I.

What is claimed is:

1. In the process of depositing a metal on a solid substrate by a Metal Organic Chemical Deposition process in which a metal precursor is provided to the substrate as a gaseous mixture of metal precursor vapor in a carrier gas, the improvement of providing the gaseous mixture by intimately contacting the carrier gas and a mixture of a solid metal precursor and a liquid having a vapor pressure below that of the solid metal precursor and in which the precursor is at least partially soluble.

2. The process of claim 1 wherein the metal precursor is trimethylindium.

3. The process of claim 2 wherein the carrier gas is hydrogen, helium,, argon or nitrogen.

4. The process of claim 2 wherein the liquid has a boiling point of at least 150° C.

5. The process of claim 4 wherein the liquid is a hydrocarbon of at least 9 carbon atoms.

6. The process of claim 5 wherein the liquid is formed by complexing between the metal precursor and a Lewis base.

7. The process of claim 6 wherein the Lewis base is a tertiary amine, a triazine free from active hydrogen atoms or a polyether.

8. A process of producing a gaseous mixture of inert carrier gas substantially saturated with vapor of a metalorganic compound by passing the carrier gas through a mixture of the solid metal compound and a liquid having a vapor pressure below that of the metal compound at the temperature of the passing and in which the metal compound is at least partially soluble in the liquid.

9. The process of claim 8 wherein the metal compound is trimethylindium.

10. The process of claim 9 wherein the liquid has a boiling point of at least 150° C.

11. The process of claim 10 wherein the liquid is a hydrocarbon.

12. The process of claim 11 wherein the liquid is formed by complexing the metal compound with a tertiary amine, a triazine free from active hydrogen atoms or a polyether.

* * * * *